US012621967B2

(12) United States Patent
Heo et al.

(10) Patent No.: US 12,621,967 B2
(45) Date of Patent: May 5, 2026

(54) DIRECT-CURRENT CONVERTER AND METHOD FOR MANUFACTURING SAME

(71) Applicant: HL MANDO CORPORATION, Gyeonggi-do (KR)

(72) Inventors: Gun Haeng Heo, Gyeonggi-do (KR); Sang Hun Yun, Gyeonggi-do (KR)

(73) Assignee: HL MANDO CORPORATION, Gyeonggi-do (KR)

( * ) Notice: Subject to any disclaimer, the term of this patent is extended or adjusted under 35 U.S.C. 154(b) by 182 days.

(21) Appl. No.: 18/084,529

(22) Filed: Dec. 19, 2022

(65) Prior Publication Data

US 2023/0121115 A1     Apr. 20, 2023

Related U.S. Application Data

(63) Continuation of application No. PCT/KR2021/015220, filed on Oct. 27, 2021.

(30) Foreign Application Priority Data

Oct. 27, 2020     (KR) ........................ 10-2020-0140166
Oct. 27, 2020     (KR) ........................ 10-2020-0140170

(51) Int. Cl.
*H05K 7/20*          (2006.01)
*B60R 16/03*          (2006.01)
(Continued)

(52) U.S. Cl.
CPC ........... *H05K 7/2089* (2013.01); *B60R 16/03* (2013.01); *H02M 3/003* (2021.05); *H02M 7/003* (2013.01)

(58) Field of Classification Search
CPC . H05K 7/2089; H05K 7/20927; H02M 3/003; H02M 7/003; B60R 16/03
See application file for complete search history.

(56) References Cited

U.S. PATENT DOCUMENTS 5,091,823 A     *     2/1992     Kanbara .............. H05K 9/0022
                                                                 361/736
2010/0026090 A1*     2/2010     Nakatsu .................. B60L 50/16
                                                                 307/9.1
(Continued)

FOREIGN PATENT DOCUMENTS

CN          105101744          11/2015
CN          105210467          12/2015
(Continued)

OTHER PUBLICATIONS

Office Action dated Mar. 27, 2024 for Korean Patent Application No. 10-2022-7032451 and its English machine translation provided by Global Dossier.

(Continued)

*Primary Examiner* — Jayprakash N Gandhi
(74) *Attorney, Agent, or Firm* — WOMBLE BOND DICKINSON (US) LLP

(57)                    ABSTRACT

According to an aspect of the present disclosure, provided is a DC converter, including a main housing having an accommodation space formed therein; a cooling module which is coupled to the main housing to partition the accommodation space into a plurality of spaces and to discharge heat generated in the accommodation space to the outside; an inductor module which is accommodated in any one space of the spaces partitioned into a plurality and located adjacent to the cooling module; and a capacitor module which is accommodated in the other one space of the spaces partitioned into a plurality and located adjacent to the cooling module.

12 Claims, 15 Drawing Sheets

(51) Int. Cl.
    *H02M 3/00*           (2006.01)
    *H02M 7/00*           (2006.01)

(56)           References Cited

U.S. PATENT DOCUMENTS

| | | | |
|---|---|---|---|
| 2011/0249421 A1* | 10/2011 | Matsuo | B60L 50/16 |
| | | | 318/400.25 |
| 2013/0241486 A1 | 9/2013 | Tomokage et al. | |
| 2014/0369006 A1* | 12/2014 | Williams | H05K 7/2089 |
| | | | 29/832 |
| 2015/0163962 A1 | 6/2015 | Suzuki et al. | |
| 2017/0127560 A1* | 5/2017 | You | H05K 5/03 |
| 2018/0042104 A1* | 2/2018 | Nagaoka | H02M 1/123 |
| 2018/0168075 A1 | 6/2018 | Okazaki et al. | |
| 2018/0174934 A1* | 6/2018 | Tani | H02M 7/003 |
| 2021/0118764 A1* | 4/2021 | Lin | H01L 21/4878 |
| 2021/0144888 A1* | 5/2021 | Sano | H05K 7/20927 |

FOREIGN PATENT DOCUMENTS

| | | | | |
|---|---|---|---|---|
| CN | 111727321 | 9/2020 | | |
| JP | 5855899 | 5/2013 | | |
| JP | 2016-42532 | 3/2016 | | |
| JP | 2016-119816 | 6/2016 | | |
| JP | 2017-112768 A | 6/2017 | | |
| JP | 2020025430 A | * 2/2020 | | H02M 7/003 |
| KR | 10-2002-0072029 | 9/2002 | | |
| KR | 10-2004-0083480 A | 10/2004 | | |
| KR | 10-0774673 | 11/2007 | | |
| KR | 10-2010-0011033 | 2/2010 | | |
| KR | 10-2011-0117048 | 10/2011 | | |
| KR | 10-1204139 | 11/2012 | | |
| KR | 10-2013-0017225 | 2/2013 | | |
| KR | 10-2013-0065390 | 6/2013 | | |
| KR | 10-2014-0114032 | 9/2014 | | |
| KR | 10-1488003 | 1/2015 | | |
| KR | 10-2015-0080399 | 7/2015 | | |
| KR | 10-2016-0053633 | 5/2016 | | |
| KR | 10-1646375 | 8/2016 | | |
| KR | 10-2016-0129696 A | 11/2016 | | |
| KR | 10-2018-0066939 | 6/2018 | | |
| WO | 2020/047583 | 3/2020 | | |

OTHER PUBLICATIONS

International Search Report for PCT/KR2021/015220 mailed on Feb. 14, 2022 and its English Machine Translation by the WIPO (now published as WO 2022/092807).

Written Opinion of the International Searching Authority for PCT/KR2021/015220 mailed on Feb. 14, 2022 and its English Machine Translation by Google Translate (now published as WO 2022/092807).

Office Action dated Jun. 26, 2024 for Korean Patent Application No. 10- 2023-7009511 and its English translation from Global Dossier.

Office Action dated Aug. 6, 2024 for Korean Patent Application No. 10- 2023-7009512 and its English translation from Global Dossier.

Office Action dated May 21, 2025 for Korean Patent Application No. 10-2023-7011977 and its English translation from Global Dossier.

Office Action (1st) dated Mar. 31, 2025 for Chinese Patent Application No. 202180044310.1 and its English translation from Global Dossier.

Notice of Allowance dated Sep. 30, 2025 for Chinese Patent Application No. 202180044310.1 and its English translation from Global Dossier.

\* cited by examiner

10

121(120)

400

131(130)

140

720

230

720

140

110

140

DIRECT-CURRENT CONVERTER AND METHOD FOR MANUFACTURING SAME

CROSS-REFERENCE TO RELATED APPLICATIONS

This application is a continuation of International Application No. PCT/KR2021/015220, filed on Oct. 27, 2021, which claims priority to and the benefit of Korean Patent Application No. 10-2020-0140166, filed on Oct. 27, 2020, and Korean Patent Application No. 10-2020-0140170, filed on Oct. 27, 2020, the disclosures of which are incorporated herein by reference in its entirety.

TECHNICAL FIELD

The present disclosure relates to a DC converter and a method for manufacturing the same, and more specifically to a DC converter that can receive DC power and adjust a voltage and output as DC power while reducing the size thereof and improving cooling efficiency, and a method for manufacturing the same.

BACKGROUND ART

The DC converter refers to a device that receives direct current (DC)-type power and adjusts a voltage to output the same. Recently, as the technical requirements for using a DC power supply increase due to issues such as power loss and the like, research on a DC converter is being actively conducted.

Examples of the device provided with a DC converter include eco-friendly vehicles such as electric vehicles (EV), fuel-cell electric vehicles (FCEV), battery electric vehicles (BEV) and the like. Regulations are strengthened on the depletion of fossil fuels and the reduction of carbon and nitrogen oxides generated by the combustion thereof, and interest in the eco-friendly vehicle is increasing.

The DC converter currently in use is generally manufactured by including a device for storing energy and a device for performing switching. As a device for storing energy, a capacitor and an inductor are provided, and as a device for performing switching, a semiconductor device such as silicon carbide (SiC) and the like is provided.

However, capacitors and inductors for storing energy generate a lot of heat as the DC converter operates. If the generated heat is not properly dissipated, the performance of the DC converter may be deteriorated, and other components constituting the DC converter may be damaged.

Accordingly, a heat transfer fluid may be considered as a method for quickly and effectively discharging heat generated from components of a DC converter such as a capacitor and an inductor.

The heat transfer fluid may be introduced into the DC converter, absorb the generated heat, and then discharge the heat inside the DC converter in the form of being discharged again.

In this case, when the heat transfer fluid flows arbitrarily in the internal space of the DC converter, the operational reliability may be deteriorated, and thus, the heat transfer fluid generally flows inside the DC converter through a separate flow path. In order for this heat dissipation process to be effectively performed, a capacitor, an inductor and the like must be located adjacent to a flow path through which the heat transfer fluid flows.

Meanwhile, as described above, in order for the DC inverter to be provided in an eco-friendly vehicle, it is required to reduce the size of the DC inverter. Accordingly, the components of the DC inverter are generally densely arranged without a dead space.

However, for effective heat dissipation, each component must be disposed adjacent to the flow path through which the supplied heat transfer fluid flows. Therefore, the conventional DC inverter had to have a cross-sectional area greater than or equal to the sum of the cross-sectional areas of its components, which caused a limitation in miniaturization of the DC inverter.

Korean Registered Patent No. 10-1204139 discloses a semiconductor device for a DC/DC converter. Specifically, by adding a heat dissipation fin for dissipating heat to a semiconductor device, the semiconductor device for a DC/DC converter capable of improving heat dissipation is disclosed.

However, this type of semiconductor device can only achieve heat dissipation of semiconductor equipment among the components constituting the DC converter. That is, the related art document does not suggest a method for improving the heat dissipation effect of the DC/DC converter itself provided with semiconductor equipment.

In addition, the heat dissipation fin, which is a method proposed by the related art document, inevitably causes an increase in the size of a semiconductor device and a DC converter including the same. Therefore, there is a limitation against the miniaturization of the size, which is one problem associated with the DC converter.

Korean Patent Application No. 10-2002-0072029 discloses a heat dissipation device for a DC/DC converter. Specifically, the heat dissipation device for a DC/DC converter in which heat generated inside the DC/DC converter can be cooled by using an insulating pad and a heat sink mounted on the upper surface of a printed circuit board formed inside an ADSL system is disclosed.

However, the heat dissipation device of this type of DC/DC converter must be provided with a separate insulating pad and heat dissipation plate. Accordingly, there is still a limitation in which it is difficult to achieve miniaturization, which is one problem associated with the DC converter.

Korean Registered Patent No. 10-1204139 (Nov. 22, 2012)

Korean Patent Application No. 10-2002-0072029 (Sep. 14, 2002)

DISCLOSURE

Technical Problem

An object of the present disclosure is to provide a DC converter which is capable of solving the above-described problems and a method for manufacturing the same.

First, an object of the present disclosure is to provide a DC converter which is capable of reducing its size and a method for manufacturing the same.

In addition, another object of the present disclosure is to provide a DC converter which is capable of improving the cooling efficiency of components and a method for manufacturing the same.

In addition, still another object of the present disclosure is to provide a DC converter which is capable of simplifying a manufacturing process and a method for manufacturing the same.

In addition, still another object of the present disclosure is to provide a DC converter which is capable of improving design freedom and a method for manufacturing the same.

Technical Solution

In order to achieve the above objects, the present disclosure provides a DC converter, including a main housing having an accommodation space formed therein; a cooling module which is coupled to the main housing to partition the accommodation space into a plurality of spaces and to discharge heat generated in the accommodation space to the outside; an inductor module which is accommodated in any one space of the spaces partitioned into a plurality and located adjacent to the cooling module; and a capacitor module which is accommodated in the other one space of the spaces partitioned into a plurality and located adjacent to the cooling module.

In addition, the present disclosure may provide a DC converter which includes the cooling module including a cooling plate having a predetermined thickness in a height direction of the main housing and a cross-section corresponding to a cross-section of the accommodation space, and which absorbs heat generated by the inductor module of the capacitor module; and a flow passage which is formed to be recessed inside the cooling plate and extends between at least two different corners among corners of the cooling plate through which a fluid absorbing the heat flows.

In addition, the present disclosure may provide a DC converter, wherein the cooling plate is disposed to be spaced apart from one end and the other end in a height direction of the main housing, wherein any one of the inductor module and the capacitor module is disposed in a space formed between the cooling plate and the one end, and wherein the other one of the inductor module and the capacitor module is disposed in a space formed between the cooling plate and the other end.

In addition, the present disclosure may provide a DC converter, wherein the cooling module includes a communication portion which is coupled through the main housing and communicates with an end of the flow passage and an external fluid supply source, respectively.

In addition, the present disclosure may provide a DC converter, wherein a fluid which is configured to absorb heat generated by the inductor module or the capacitor module flows in the flow passage.

In addition, the present disclosure may provide a DC converter which further includes a semiconductor module which is accommodated in any one space of the spaces partitioned into a plurality and located adjacent to the capacitor module and the cooling module, respectively, wherein the capacitor module is located to be biased to one side of the one space, and wherein the semiconductor module is located to be biased toward the other side of the one space.

In addition, the present disclosure provides a method for manufacturing a DC converter, including the steps of (a) forming a plurality of spaces inside a main housing; (b) accommodating a component in one side space of the interior of the main housing; and (c) accommodating a component in the other side space of the main housing.

In addition, the present disclosure may provide a method for manufacturing a DC converter, wherein step (a) includes the step of (a1) accommodating a cooling plate in an accommodation space of a housing body to partition the accommodation space into an upper space and a lower space.

In addition, the present disclosure may provide a method for manufacturing a DC converter, wherein step (b) includes the steps of (b1) covering a cooling plate accommodated inside the main housing by an inductor module to be accommodated in the one side space; and (b2) covering the inductor module and the one side space by a housing cover to be coupled to a housing body, so as to seal the one side space.

In addition, the present disclosure may provide a method for manufacturing a DC converter, wherein step (c) includes the step of (c1) covering a cooling plate accommodated inside the main housing by a capacitor module to be accommodated in the other side space.

In addition, the present disclosure may provide a method for manufacturing a DC converter, wherein step (c) includes the steps of (c2) covering the cooling plate accommodated inside the main housing by a semiconductor module to be accommodated in the other side space; (c3) covering the semiconductor module by a shielding module to be accommodated in the other side space; (c4) covering the shielding module by a PCB unit to be accommodated in the other side space; and (c5) covering the capacitor module, the semiconductor module, the shielding module and the PCB unit by a housing cover to be coupled to a housing body, so as to seal the other side space.

Advantageous Effects

According to an exemplary embodiment of the present disclosure, the following effects can be achieved.

First, the inner space of the main housing accommodating the components of the DC inverter is partitioned into a plurality. Among the components, the inductor module and the capacitor module, which are formed to have relatively large sizes, are accommodated in different spaces among the partitioned spaces, respectively.

Accordingly, an increase in the overall size of the DC converter is not required to accommodate both of the inductor module and the capacitor module in a single space. Accordingly, the size of the DC inverter can be reduced.

In addition, the internal space of the DC converter is partitioned by a cooling plate. A flow passage through which a fluid for heat exchange flows is formed in the cooling plate. The flow passage may communicate with the outside of the main housing to receive the fluid before heat exchange, and discharge the heat-exchanged fluid.

In an exemplary embodiment, some of the components of the DC converter, that is, an inductor module or a capacitor module, may be located adjacent to the cooling plate. Heat generated as the inductor module or the capacitor module is operated is transferred to the cooling plate and the fluid flowing in the cooling plate such that the inductor module or the capacitor module may be cooled.

Furthermore, the inductor module and the capacitor module are disposed to face each other with the cooling plate interposed therebetween. That is, the inductor module and the capacitor module are accommodated in different spaces and are physically spaced apart from each other.

Therefore, not only heat generated in the inductor module and the capacitor module can be effectively dissipated, but also the heat generated in one of the inductor module and the capacitor module does not affect the other.

As a result, heat generated according to the operation of the DC inverter can be effectively dissipated, and thus, the cooling efficiency of each component of the DC inverter can be improved.

In addition, the inductor module is accommodated and fixed in any one space of the spaces partitioned by the cooling plate. The capacitor module is accommodated and fixed in the other one space of the spaces partitioned by the cooling plate. That is, the inductor module and the capacitor module may be accommodated in the accommodation space through separate openings.

Accordingly, there is no need for a method for accommodating the inductor module and the capacitor module through the same opening. Accordingly, the manufacturing process of the DC converter can be simplified.

In addition, the inductor module and the capacitor module, which are formed to have relatively large volumes among the components, are accommodated in physically partitioned separate spaces.

Therefore, a complex arrangement structure for accommodating both of the inductor module and the capacitor module in a single space is not required. As a result, the design freedom of the DC converter can be improved.

MODES OF THE INVENTION

Hereinafter, the DC converter and the manufacturing method thereof according to an exemplary embodiment of the present disclosure will be described in detail with reference to the accompanying drawings.

In the following description, in order to clarify the characteristics of the present disclosure, the descriptions of some components may be omitted.

1. Definition of Terms

As used in the following description, the term "communication" means that one or more members are fluidly connected to each other. In an exemplary embodiment, a communication between one or more members may be formed by a member such as a pipe, a tube or the like.

The term "energization" used in the following description means that one or more members are connected to each other so as to transmit a current or an electrical signal. In an exemplary embodiment, the energized state may be formed by a wired method using a conducting wire member or the like or a wireless method using Bluetooth, RFID, Wi-Fi or the like.

The terms "top", "bottom", "front side", "rear side", "left" and "right" used in the following description are understood with reference to the coordinate systems illustrated in FIGS. 1 to 7 and 9.

2. Description of the Configuration of a DC Converter 10 According to an Exemplary Embodiment of the Present Disclosure In a DC converter 10 according to an exemplary embodiment of the present disclosure, a plurality of internal spaces of the main housing 100 for accommodating components may be partitioned. In this case, the components partitioning the inner space of the main housing 100 may be configured to be in direct or indirect contact with other components accommodated in the inner space so as to exchange heat.

Accordingly, a plurality of components provided in the DC converter 10 may be cooled by directly or indirectly contacting the components for heat exchange and a plurality of surfaces instead of a single plane. Accordingly, even if a part of each component included in the DC converter 10 is disposed to be stacked on each other, the generated heat may be efficiently discharged.

Figure 1:
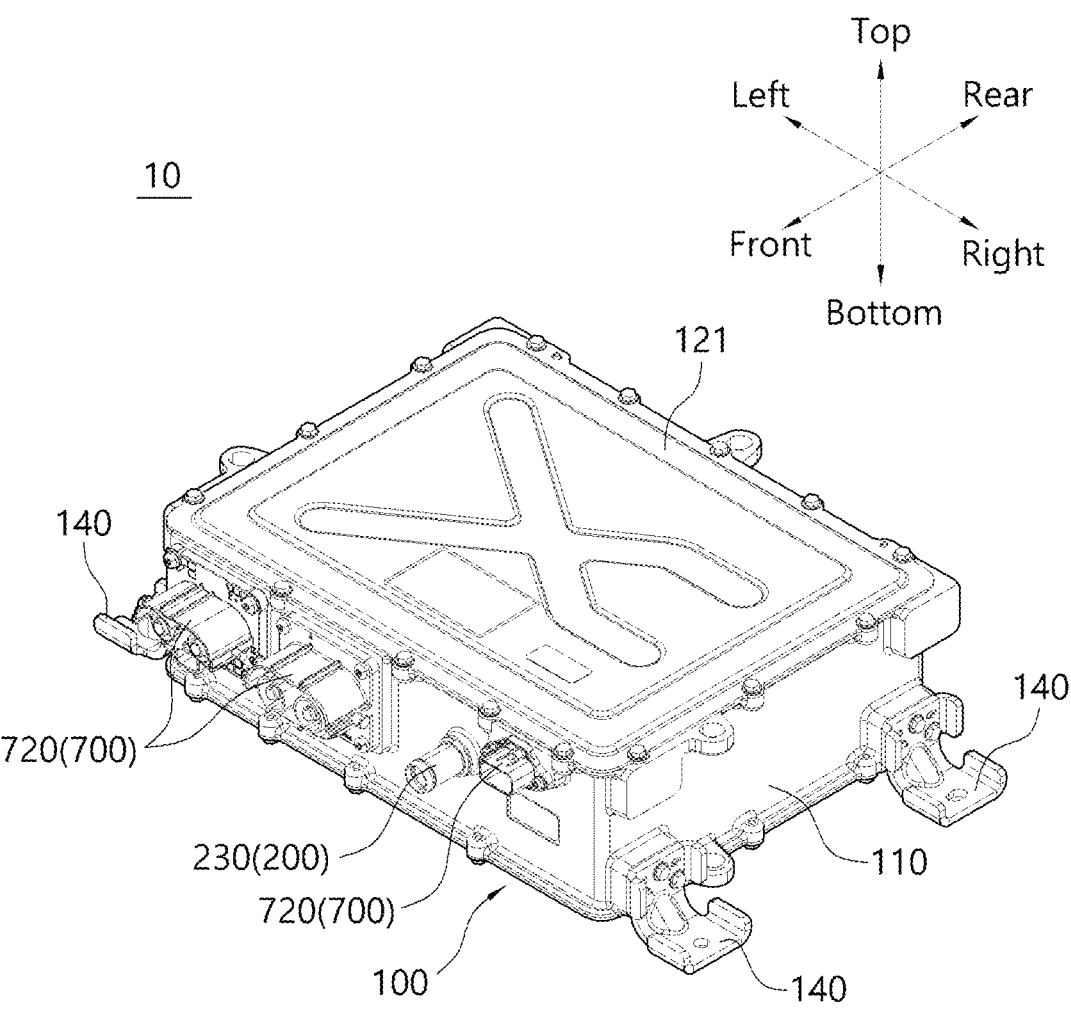
FIG. 1 is a perspective view illustrating the DC converter according to an exemplary embodiment of the present disclosure.
Figure 2:
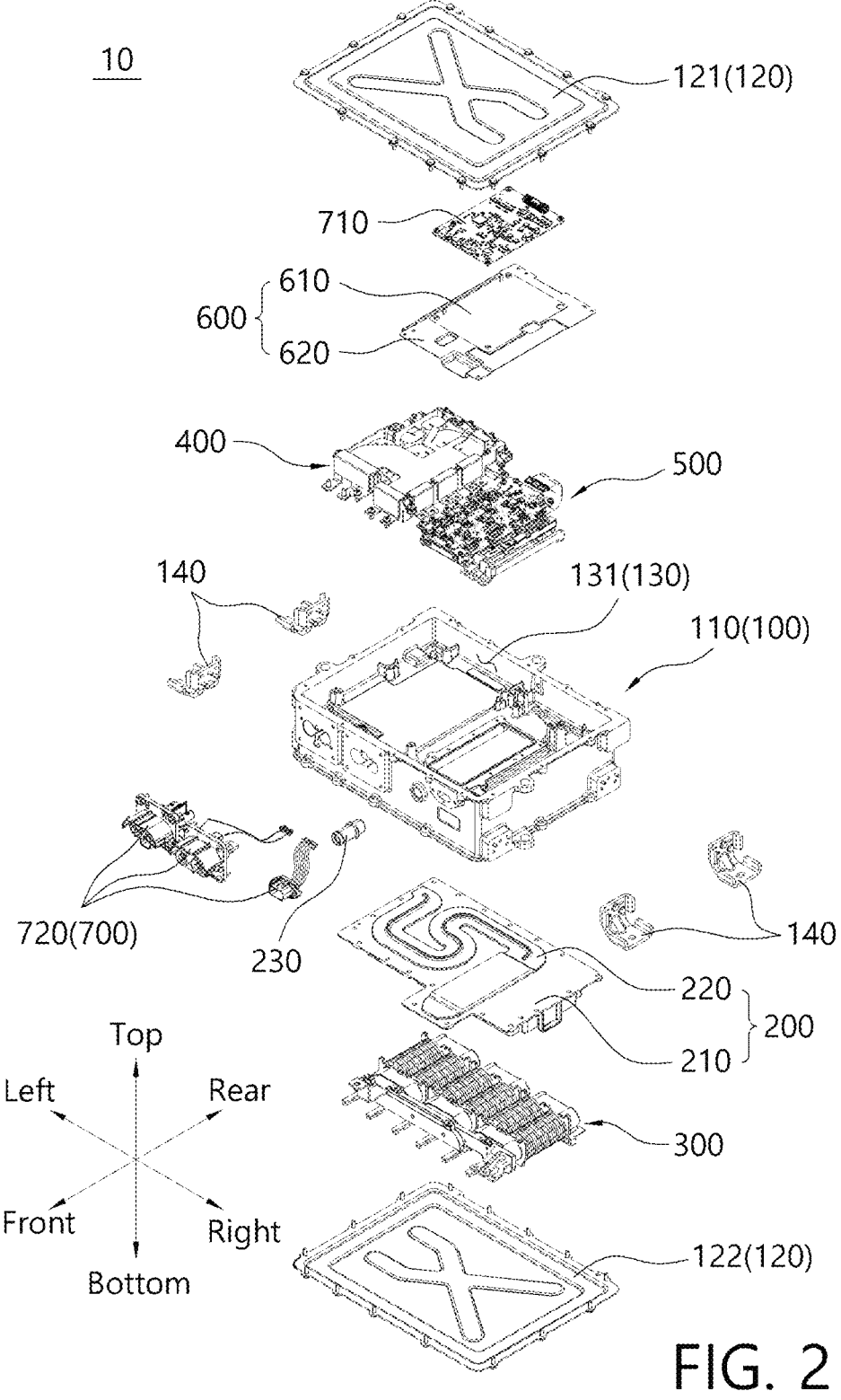
FIG. 2 is an exploded perspective view illustrating components of the DC converter of FIG. 1.

Hereinafter, the configuration of the DC converter 10 according to an exemplary embodiment of the present disclosure will be described with reference to FIGS. 1 to 2.

In the illustrated exemplary embodiment, the DC converter 10 includes a main housing 100, a cooling module 200, an inductor module 300, a capacitor module 400, a semiconductor module 500, a shielding module 600 and an energization module 700.

The main housing 100 forms the body of the DC converter 10. The main housing 100 may have a space formed therein to mount the components of the DC converter 10. Each component of the DC converter 10 is accommodated in the space of the main housing 100 and is not arbitrarily exposed to the outside.

In the illustrated exemplary embodiment, the main housing 100 includes a housing body 110, a housing cover 120, an accommodation space 130 and a bracket 140.

The housing body 110 forms the body of the main housing 100. In addition, the housing body 110 may mount various components constituting the DC converter 10 therein.

In addition, the housing body 110 has a space for accommodating the components therein, and may be provided in any shape in which the space may be shielded. In the illustrated exemplary embodiment, the housing body 110 has a rectangular cross-section in which the length in the left-right direction is longer than the length in the front-rear direction, and is formed in the form of a square pillar having a height in the vertical direction.

The housing body 110 partially surrounds the accommodation space 130. In the illustrated exemplary embodiment, the housing body 110 is formed to surround the front side, the rear side, the left side and the right side of the accommodation space 130.

That is, openings are formed in other parts of the accommodation space 130, which are upper and lower sides in the illustrated exemplary embodiment, and components of the DC converter 10 may enter the accommodation space 130 through the openings.

The openings of the housing body 110, which are the upper and lower openings in the illustrated exemplary embodiment, are shielded by the housing cover 120.

The housing cover 120 is coupled to the housing body 110 to prevent the components accommodated in the accommodation space 130 from being arbitrarily exposed to the outside. In an exemplary embodiment, the housing cover 120 may be fixedly coupled to the housing body 110. The coupling may be formed by a screw member or the like.

The housing cover 120 may be formed in a shape corresponding to the cross-section of the housing body 110. In the illustrated exemplary embodiment, the housing body 110 is formed in a rectangular shape in which the extension length in the front-rear direction is shorter than the extension length in the left-right direction, and the housing cover 120 also may be formed to have a rectangular cross-section in which the extension length in the front-rear direction is shorter than the extension length in the left-right direction.

A plurality of housing covers 120 may be provided. The plurality of housing covers 120 may be disposed to seal the openings of the housing body 110 at different positions. In the illustrated exemplary embodiment, the housing cover 120 includes an upper cover 121 for covering the upper opening of the housing body 110 and a lower cover 122 for covering the lower opening of the housing body 110.

As will be described below, the accommodation space 130 formed inside the housing body 110 may be partitioned into an upper space 131 and a lower space 132. Accordingly, it can be said that the housing cover 120 is disposed to cover the accommodation space 130, the upper cover 121 is disposed to cover the upper space 131, and the lower cover 122 is disposed to cover the lower space 132.

The accommodation space 130 is a space formed inside the housing body 110. The accommodation space 130 is surrounded by the housing body 110 and the housing cover 120, and any communication with the outside may be blocked.

In the illustrated exemplary embodiment, the accommodation space 130 is surrounded by the housing body 110 in the horizontal direction thereof, that is, the front side, the rear side, the left side and the right side. In addition, the accommodation space 130 is surrounded by the upper cover 121 and the lower cover 122 in the vertical direction thereof, that is, the upper and lower sides, respectively.

The accommodation space 130 may be provided in any shape capable of accommodating the components of the DC converter 10. In the illustrated exemplary embodiment, the housing body 110 surrounding the accommodation space 130 is formed to have a rectangular cross-section, and the accommodation space 130 also may be formed to have a rectangular cross-section and may be formed as a space in the shape of a square column extending in the vertical direction.

The accommodation space 130 may communicate with the outside. Through the communication, a fluid for cooling the components of the DC converter 10 may flow in and out of the accommodation space 130. The communication is achieved by the communication portion 230 which is through-coupled to the housing body 110.

The heat exchange process and the flow process are achieved by the cooling module 200, and the detailed description thereof will be described below.

The accommodation space 130 may be energized with the outside. By the energization, a current required for the DC converter 10 to operate, a control signal for control and the like may be transmitted to the accommodated components. The energization is achieved by the connector unit 720 of the energization module 700, and the detailed description thereof will be described below.

The accommodation space 130 may be partitioned into a plurality of spaces. A plurality of partitioned spaces are physically spaced apart from each other, and different components may be mounted in each space. In this case, at least one or more of the components accommodated in each space may be in contact with the cooling module 200 for cooling.

The compartment may be achieved by the cooling module 200. Specifically, the cooling plate 210 of the cooling module 200 is accommodated in the accommodation space 130 to partition the accommodation space 130 into an upper space 131 and a lower space 132. As the name suggests, the upper space 131 is formed on the upper side of the cooling plate 210. In addition, the lower space 132 is formed on the lower side of the cooling plate 210.

Some of the components of the DC converter 10 may be accommodated in the upper space 131. In the illustrated exemplary embodiment, the capacitor module 400, the semiconductor module 500 and the shielding module 600 are accommodated in the upper space 131.

Some of the components accommodated in the upper space 131 may be in contact with the cooling plate 210. In an exemplary embodiment, some of the components may be in direct contact with the cooling plate 210.

In the illustrated exemplary embodiment, the capacitor module 400 and the semiconductor module 500 may be in contact with the cooling plate 210. Accordingly, heat generated by the operation of the capacitor module 400 and the semiconductor module 500 may be transferred to the fluid introduced through the cooling plate 210.

As a result, the capacitor module 400 and the semiconductor module 500 may be cooled to improve operational reliability.

The remaining part of the components of the DC converter 10 may be accommodated in the lower space 132. In the illustrated exemplary embodiment, the inductor module 300 is accommodated in the lower space.

The remaining part of the components accommodated in the lower space 132 may be in contact with the cooling plate 210. In an exemplary embodiment, the remaining part of the components may be in direct contact with the cooling plate 210.

In the illustrated exemplary embodiment, the inductor module 300 may be in contact with the cooling plate 210. Accordingly, heat generated by the operation of the inductor module 300 may be transferred to the fluid introduced through the cooling plate 210.

As a result, the inductor module 300 may be cooled to improve operational reliability.

In other words, the accommodation space 130 is partitioned into a plurality of spaces, which are an upper space 131 and a lower space 132 in the illustrated exemplary embodiment, and different components are accommodated in each space 131 and 132, respectively, so as to be in contact with the cooling plate 210.

Accordingly, when each component is disposed as a single layer, the area required for contact between each component and the cooling plate 210 is reduced compared to the area required for contact between each component and the cooling plate 210.

Accordingly, the cross-sectional area of the accommodation space 130 and the cross-sectional area of the housing body 110 surrounding the accommodation space 130 are also reduced, and thus, the overall size of the DC converter 10 may be reduced.

The bracket 140 is a part to which the DC converter 10 is coupled to the outside. In an exemplary embodiment, the DC converter 10 may be provided in an electric vehicle (EV), a hybrid electric vehicle (HEV), a fuel-cell vehicle (FCV) or the like. In this case, the DC converter 10 may be fixedly coupled to the EV, HEV or FCV through the bracket 140.

The bracket 140 includes at least one bent portion and is formed to extend. One side of the bracket 140 is coupled to the outside of the housing body 110. The other side of the bracket 140 may be coupled to a vehicle in which the DC converter 10 is provided.

A plurality of brackets 140 may be provided. The plurality of brackets 140 may be coupled to the housing body 110 at different positions. In the illustrated exemplary embodiment, four brackets 140 are provided, respectively, which are coupled to the left and right front side and rear side ends, respectively.

The number and arrangement method of the brackets 140 may be changed to any number and arrangement method capable of fixedly coupling the DC converter 10 to any member.

The cooling module 200 receives heat generated from the components of the DC converter 10 and discharges it to the outside. By the cooling module 200, heat generated when the DC converter 10 is operated may be discharged to the outside.

In addition, the cooling module 200 partitions the accommodation space 130 of the main housing 100 into a plurality of spaces. In the illustrated exemplary embodiment, the cooling module 200 is located in the height direction of the accommodation space 130, that is, in the vertical direction such that the accommodation space 130 is partitioned into the upper space 131 and the lower space 132 as described above.

The cooling module 200 is coupled to the main housing 100. Specifically, some components of the cooling module 200 are coupled to the housing body 110, and the remaining parts are accommodated in the accommodation space 130.

In the illustrated exemplary embodiment, the cooling module 200 includes a cooling plate 210, a flow passage 220 and a communication portion 230.

The cooling plate 210 partitions the accommodation space 130 into a plurality of spaces. In addition, the cooling plate 210 is configured to directly or indirectly contact the components of the DC converter 10 to receive heat generated from the components. The heat transferred to the cooling plate 210 may be transferred to the fluid flowing along the flow passage 220 formed in the cooling plate 210 to be discharged to the outside.

As the name suggests, the cooling plate 210 may be provided in a plate shape having a predetermined thickness. The cooling plate 210 may be formed to have a cross-section corresponding to the accommodation space 130.

In the illustrated exemplary embodiment, it will be understood that the accommodation space 130 is a rectangle in which the length in the front-rear direction is shorter than the length in the left-right direction, and the cooling plate 210 may also be formed in a rectangular plate shape corresponding to the above shape.

The cooling plate 210 may be formed of a material having high thermal conductivity. This is so that heat generated from each component accommodated in the accommodation space 130 is more effectively transferred to the cooling plate 210.

The cooling plate 210 may directly or indirectly contact the components accommodated in the accommodation space 130. In an exemplary embodiment, the cooling plate 210 may be in direct contact with the capacitor module 400 and the semiconductor module 500 accommodated in the upper space 131. In addition, the cooling plate 210 may be in direct contact with the inductor module 300 accommodated in the lower space 132.

A flow passage 220 is formed in the cooling plate 210.

The flow passage 220 forms a path through which a fluid that receives heat transferred to the cooling plate 210 and discharges to the outside flows.

The flow passage 220 is formed in the cooling plate 210. In the illustrated exemplary embodiment, the flow passage 220 is formed as a groove which is formed to be recessed by a predetermined depth from the surface of the cooling plate 210. In order to prevent any leakage of the fluid flowing along the flow passage 220, the flow passage 220 may be sealed by a cover member (not illustrated).

The flow passage 220 may be extended between edges of the cooling plate 210. In the exemplary embodiment illustrated in FIG. 2, one end of the flow passage 220 is located at the left edge of the cooling plate 210. In addition, the other end of the flow passage 220 is located at the front edge of the cooling plate 210.

The flow passage 220 may be extended to have various shapes inside the cooling plate 210. The flow distance of the fluid flowing along the flow passage 220 is increased by the shape such that heat exchange time and efficiency between the heat generated in the components accommodated in the accommodation space 130 and the fluid may be improved.

In the illustrated exemplary embodiment, the flow passage 220 is formed to have six curved portions, and the direction is changed from one end to the other end seven times and is extended.

The flow passage 220 communicates with the outside. Specifically, one end of the flow passage 220 may communicate with an external fluid supply source (not illustrated), and the other end may communicate with an external fluid accommodation portion (not illustrated). The communication is achieved by the communication portion 230 coupled to the housing body 110. The flow passage 220 communicates with the communication portion 230.

The communication portion 230 is coupled to the housing body 110 to communicate with the accommodation space 130 and the outside. Specifically, the communication portion 230 is connected to an end of the flow passage 220 formed on the cooling plate 210 to communicate with the flow passage 220 and the outside.

The communication portion 230 may be coupled through the housing body 110. A part of the communication portion 230 may be exposed to the outside of the housing body 110 to communicate with an external fluid source (not illustrated) or a fluid accommodation portion (not illustrated). After the fluid enters and flows into the flow passage 220 through the communication portion 230, it may be discharged to an external fluid accommodation portion (not illustrated) through the communication portion 230 again.

A plurality of communication portions 230 may be provided. The plurality of communication portions 230 may be coupled to the housing body 110 at different positions. In the exemplary embodiment shown in FIG. 4, two communication portions 230 may be provided to be respectively disposed on the front side and the left side of the housing body 110.

The plurality of communication portions 230 may communicate with the ends of the flow passage 220 at different positions. In the above exemplary embodiment, the plurality of communication portions 230 communicate with the one end and the other end of the flow passage 220, respectively.

Any one of the plurality of communication portions 230 may communicate with an external fluid source (not illustrated). The other one of the plurality of communication portions 230 communicates with an external fluid accommodation portion (not illustrated), respectively. In the illustrated exemplary embodiment, it will be understood that two communication portions 230 are provided, any one communication portion 230 communicates with an external fluid supply source (not illustrated), and the other communication portion 230 communicates with an external fluid accommodation portion (not illustrated).

The inductor module 300 stores the applied power together with the capacitor module 400 and transmits the stored power to other components. Since the operation process of the inductor module 300 is a well-known technique, the detailed description thereof will be omitted.

The inductor module 300 is accommodated in the accommodation space 130. Specifically, in the exemplary embodiment shown in FIG. 2, the inductor module 300 is accommodated in the lower space 132. Accordingly, the inductor module 300 is physically separated from the capacitor module 400 by the cooling plate 210.

In addition, the inductor module 300 is disposed to be stacked with the capacitor module 400 with the cooling plate 210 interposed therebetween. As described above, the size of the DC converter 10 may be reduced by the arrangement method.

The inductor module 300 may be disposed to directly or indirectly contact the cooling plate 210. In an exemplary embodiment, the inductor module 300 may be disposed in direct contact with the cooling plate 210.

Accordingly, heat generated as the inductor module 300 is operated may be discharged more efficiently.

The inductor module 300 is energized with the outside. An external current flows into the inductor module 300, and the inductor module 300 stores energy by using the introduced current. In addition, the inductor module 300 may transmit stored energy to the outside. The energization is achieved by a connector unit 720 to be described below.

The capacitor module 400 stores energy applied together with the inductor module 300 and transfers the stored energy to other components. Since the operation process of the capacitor module 400 is a well-known technique, the detailed description thereof will be omitted.

The capacitor module 400 is accommodated in the accommodation space 130. Specifically, in the exemplary embodiment shown in FIG. 2, the capacitor module 400 is accommodated in the upper space 131. Accordingly, the capacitor module 400 is physically separated from the inductor module 300 by the cooling plate 210.

In addition, the capacitor module 400 is disposed to be stacked with the inductor module 300 with the cooling plate 210 interposed therebetween. As described above, the size of the DC converter 10 may be reduced by the arrangement method.

The capacitor module 400 may be disposed to directly or indirectly contact the cooling plate 210. In an exemplary embodiment, the capacitor module 400 may be disposed in direct contact with the cooling plate 210.

Accordingly, heat generated as the capacitor module 400 is operated may be discharged more efficiently.

The capacitor module 400 is energized with the outside. An external current flows into the capacitor module 400, and the capacitor module 400 stores energy by using the introduced current. In addition, the capacitor module 400 may transmit stored energy to the outside. The energization may also be achieved by a connector unit 720 to be described below.

The semiconductor module 500 converts the applied DC power into AC power by repeating the switching operation. Power applied by the operation of the semiconductor module 500 may be stored as energy in the inductor module 300 and the capacitor module 400.

Since the operation process of the semiconductor module 500 is a well-known technique, the detailed description thereof will be omitted.

The semiconductor module 500 is accommodated in the accommodation space 130. Specifically, in the exemplary embodiment illustrated in FIG. 2, the semiconductor module 500 is accommodated in the upper space 131.

As described above, the capacitor module 400 is also accommodated in the upper space 131. Accordingly, the capacitor module 400 is disposed on one side of the upper space 131, which is on the left side in the illustrated exemplary embodiment, and the semiconductor module 500 is disposed on the other side of the upper space 131, which is on the right side in the illustrated exemplary embodiment.

The semiconductor module 500 is physically spaced apart from the inductor module 300 by the cooling plate 210. In addition, the semiconductor module 500 is disposed to be stacked with the inductor module 300 with the cooling plate 210 interposed therebetween. Accordingly, the size of the DC converter 10 may be reduced.

The semiconductor module 500 may be disposed to directly or indirectly contact the cooling plate 210. In an exemplary embodiment, the semiconductor module 500 may be disposed in direct contact with the cooling plate 210.

Accordingly, heat generated as the semiconductor module 500 is operated may be discharged more efficiently.

The shielding module 600 physically and electrically separates the semiconductor module 500 and the PCB unit 710 of the energizing module 700.

The shielding module 600 is located between the semiconductor module 500 and the PCB unit 710. The shielding module 600 may be configured to block direct contact between the semiconductor module 500 and the PCB unit 710. In addition, the shielding module 600 may cut off electricity between the semiconductor module 500 and the PCB unit 710 to electrically separate the semiconductor module 500 and the PCB unit 710.

The shielding module 600 is accommodated in the accommodation space 130. Specifically, in the exemplary embodiment illustrated in FIG. 2, the shielding module 600 is accommodated in the upper space 131. The shielding module 600 is disposed to cover the semiconductor module 500 accommodated in the upper space 131. In other words, the semiconductor module 500, the shielding module 600 and the PCB unit 710 are sequentially stacked.

Accordingly, it will be understood that the shielding module 600 is disposed on the other side of the upper space 131, that is, disposed on the right side of the upper space 131, in the same way as the semiconductor module 500.

The shielding module 600 may include a plurality of components. Each component may be configured to physically and electrically separate the semiconductor module 500 and the PCB unit 710.

In the illustrated exemplary embodiment, the shielding module 600 includes a shield plate 610 and an insulating paper 620.

The shield plate 610 physically separates the semiconductor module 500 from the PCB unit 710. Due to the shield plate 610, the semiconductor module 500 and the PCB unit 710 do not contact each other.

The shield plate 610 covers the semiconductor module 500 and is accommodated in the upper space 131. The size and shape of the shield plate 610 may be changed according to the size and shape of the semiconductor module 500.

The insulating paper 620 electrically separates the semiconductor module 500 and the PCB unit 710 from each other. Due to the insulating paper 620, the semiconductor module 500 and the PCB unit 710 are not energized with each other.

The insulating paper 620 covers the shield plate 610 and is accommodated in the upper space. The size and shape of the insulating paper 620 may be determined according to the size and shape of the shield plate 610 and the PCB unit 710.

The energization module 700 is a part that connects the DC converter 10 to an external power source and a load. The energization module 700 is energized with an external power source and load.

The energization module 700 may conduct electricity with components of the DC converter 10, for example, the inductor module 300, the capacitor module 400 and the semiconductor module 500. The energization module 700, the inductor module 300, the capacitor module 400 and the semiconductor module 500 may transmit current to each other.

The energization module 700 is coupled to the main housing 100. In the illustrated exemplary embodiment, some components of the energization module 700 are accommodated in the accommodation space 130, and other components are partially exposed to the outside of the main housing 100.

In the illustrated exemplary embodiment, the energization module 700 includes a PCB unit 710 and a connector unit 720.

The PCB unit 710 is operated according to a control signal transmitted from the outside to control the operations of the inductor module 300, the capacitor module 400 and the semiconductor module 500. Since the operation process of the PCB unit 710 is a well-known technique, the detailed description thereof will be omitted.

The PCB unit 710 is accommodated in the accommodation space 130. Specifically, the PCB unit 710 covers the insulating paper 620 accommodated in the upper space 131 and is accommodated in the upper space 131. Accordingly, it can be said that the PCB unit 710 covers the semiconductor module 500 and is accommodated in the upper space 131.

As the PCB unit 710 is disposed to cover the semiconductor module 500, it will be understood that the PCB unit 710 is also located on the other side of the upper space 131, which is biased toward the right side in the illustrated exemplary embodiment.

The PCB unit 710 conducts electricity with the inductor module 300, the capacitor module 400 and the semiconductor module 500. The PCB unit 710 may control the inductor module 300, the capacitor module 400 and the semiconductor module 500 according to the received control signal.

Current and control signals required for the PCB unit 710 to calculate and operate the control signals may be transmitted through the connector unit 720. The PCB unit 710 is electrically connected to the connector unit 720.

The connector unit 720 is energized with an external power source and load. In addition, the connector unit 720 may be energized with the PCB unit 710 and transmit the received control signal and power to the PCB unit 710.

The connector unit 720 penetrates through the housing body 110 and is partially accommodated in the accommodation space 130. That is, a part of the connector unit 720 may be accommodated in the accommodation space 130, and the other part of the connector unit 720 may be exposed to the outside of the main housing 100. It will be understood that the other part is energized with an external power source and load.

A plurality of connector units 720 may be provided. The plurality of connector units 720 may be energized with different external power sources and loads. In the illustrated exemplary embodiment, the connector unit 720 is provided with a total of three, including a pair (i.e., two) located on the left side of the front and one located on the right side. The number and arrangement of the connector units 720 may be changed.

Since the process in which the connector unit 720 is energized with an external power source and load is a well-known technique, the detailed description thereof will be omitted.

3. Description of the Method for Manufacturing a DC Converter 10 According to the Exemplary Embodiment of the Present Disclosure The DC converter 10 according to an exemplary embodiment of the present disclosure is formed by accommodating the above-described components. In this case, the inductor module 300 and the capacitor module 400 having relatively large volumes compared to other components may be respectively accommodated in the spaces partitioned by the cooling plate 210, that is, the upper space 131 and the lower space 132.

At the same time, the inductor module 300 and the capacitor module 400 may be cooled by contacting the other surfaces of the cooling plate 210, respectively.

Accordingly, while the inductor module 300 and the capacitor module 400 can be effectively cooled, the size of the DC converter 10 may be reduced.

Hereinafter, the method for manufacturing a DC converter 10 according to an exemplary embodiment of the present disclosure will be described in detail with reference to FIGS. 3 to 15.

In the illustrated exemplary embodiment, the method for manufacturing a DC converter 10 includes a step (S100) of accommodating a component in one space inside a main housing 100 and step (S200) of accommodating a component in the other space inside the main housing 100.

(1) Description of the Step (S100) of Accommodating a Component in One Space Inside a Main Housing 100.

It is a step (S100) in which the internal space of the main housing 100 is partitioned into a plurality of spaces, and the component of the DC converter 10 are accommodated in any one space of the partitioned space. Hereinafter, this step (S100) will be described in detail with reference to FIGS. 3 to 5, 12 and 14.

Figure 3:
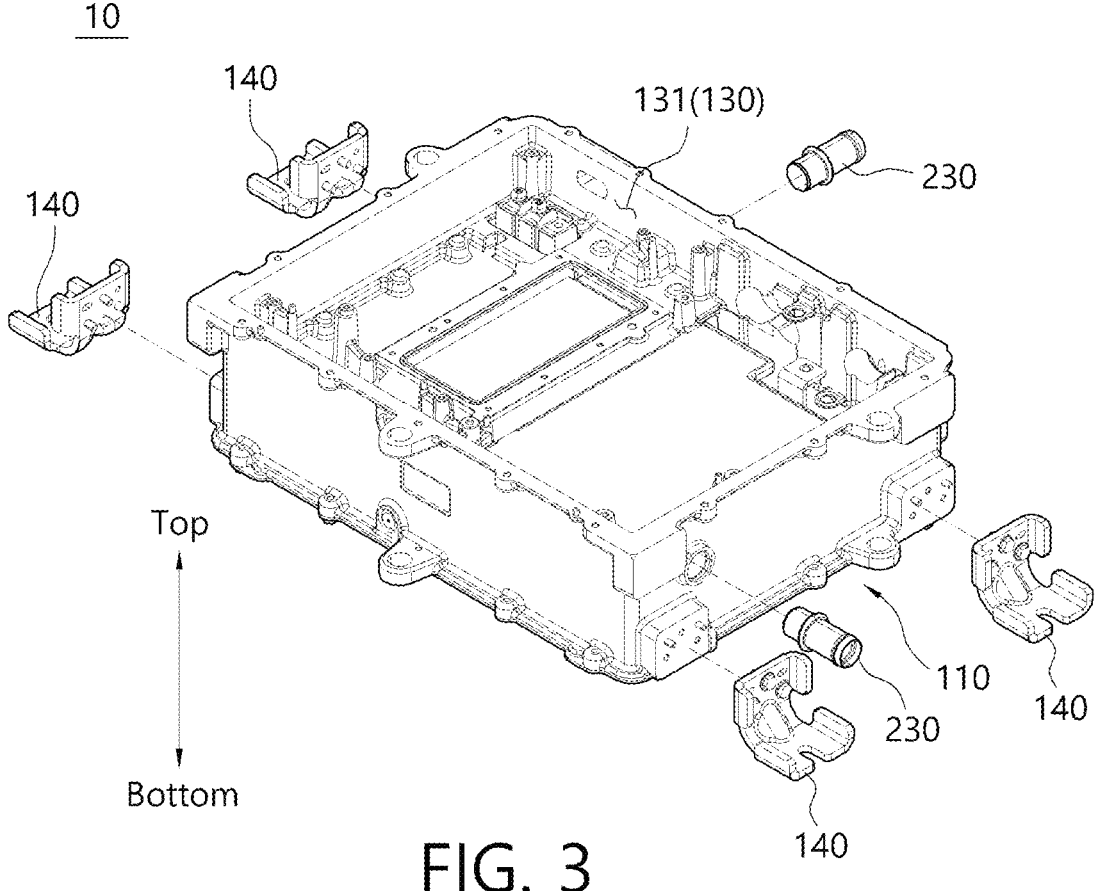
FIGS. 3 and 4 are exploded perspective views illustrating the coupling process of a main housing and a cooling module provided in the DC converter of FIG. 1.

Referring to FIG. 3, first, a bracket 140 is coupled to the outside of the housing body 110 of the main housing 100 (S110). As this step (S110) proceeds, the completed DC converter 10 may be coupled to a required position in the above-described EV, HEV, FCV and the like.

Next, a plurality of communication portions 230 are also coupled to the housing body 110 (S120). As described above, the plurality of communication portions 230 are coupled through the housing body 110, and a part thereof is located in the accommodation space 130, and the other part may be exposed to the outside of the housing body 110. Accordingly, the accommodation space 130 may communicate with a fluid supply source (not illustrated) and a fluid accommodating portion (not illustrated) which are located outside the housing body 110.

Figure 4:
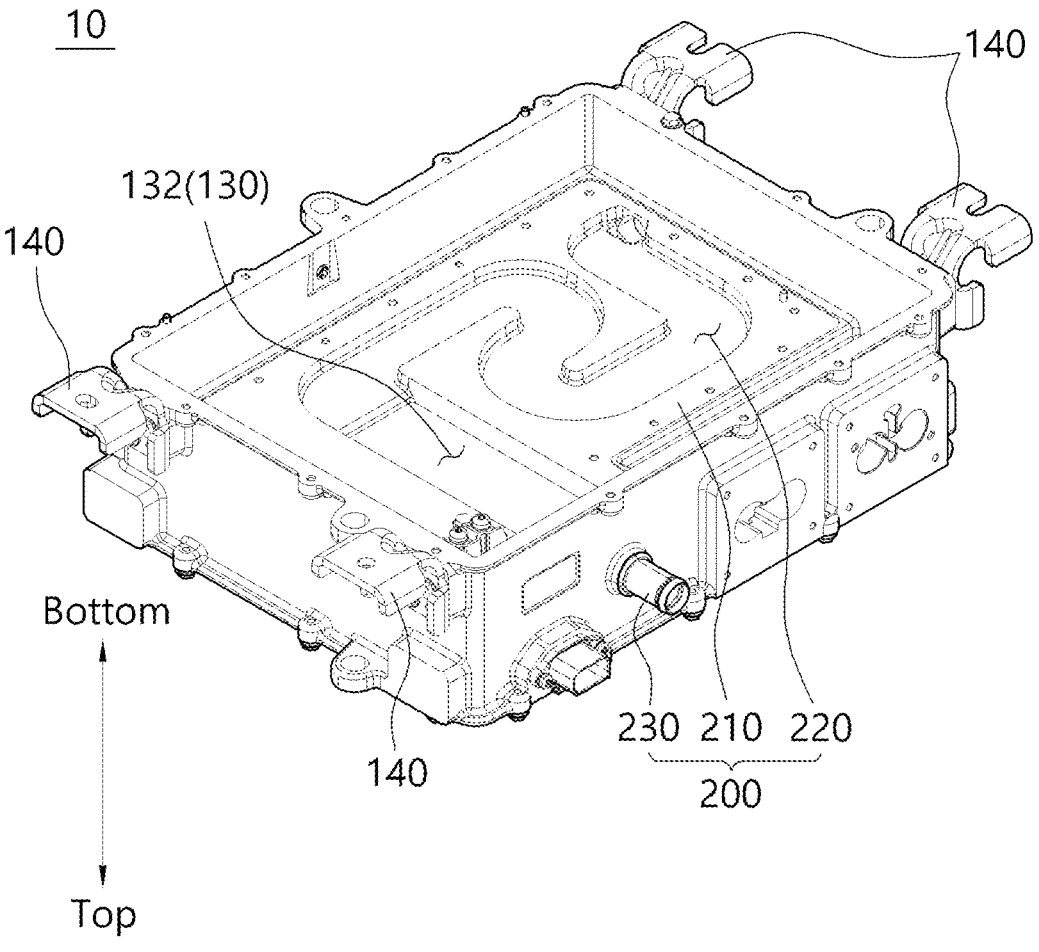

Referring to FIG. 4, the cooling module 200, specifically, the cooling plate 210 is accommodated in the accommodation space 130 and coupled to the housing body 110 (S130). The cooling plate 210 may be located to be spaced apart from an end of the accommodation space 130 in a height direction, that is, an upper end and a lower end in the illustrated exemplary embodiment, respectively.

Accordingly, the accommodation space 130 may be partitioned into an upper space 131 located above the cooling plate 210 and a lower space 132 located below the cooling plate 210.

In the illustrated exemplary embodiment, the cooling plate 210 is illustrated to be accommodated in the accommodation space 130 through the lower opening of the housing body 110. Alternatively, the cooling plate 210 may be accommodated in the accommodation space 130 through the upper opening of the housing body 110.

The accommodated cooling plate 210 may be coupled to the housing body 110 through a separate fastening member (not illustrated).

Figure 5:
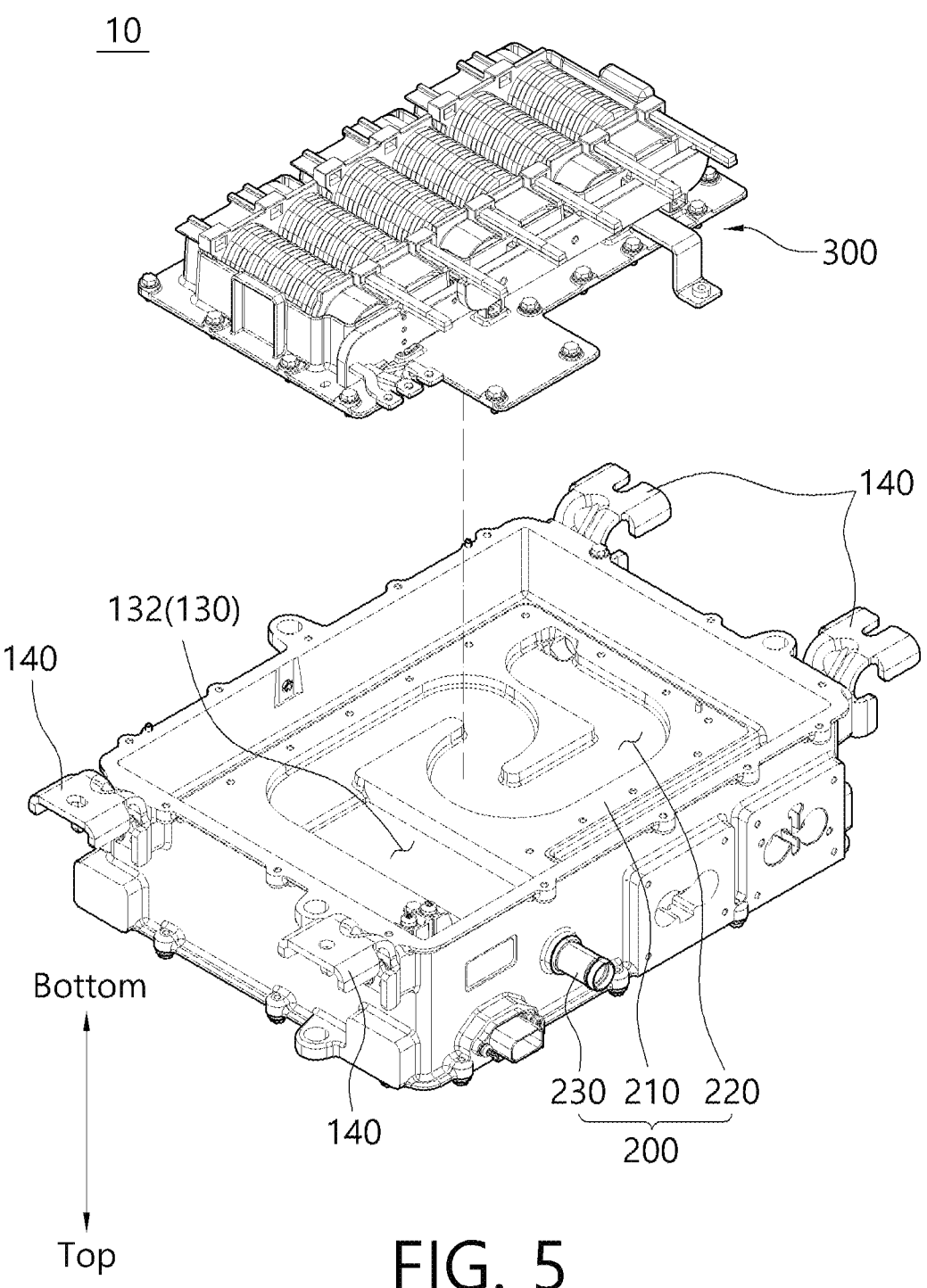
FIG. 5 is an exploded perspective view illustrating the coupling process of a main housing and an inductor module provided in the DC converter of FIG. 1.

Referring to FIG. 5, the inductor module 300 is accommodated in the accommodation space 130, specifically, the lower space 132 (S140). In this case, the inductor module 300 is accommodated in the lower space 132 while covering the cooling plate 210.

In an exemplary embodiment, the inductor module 300 may be disposed to contact the cooling plate 210 as described above.

Figure 12:
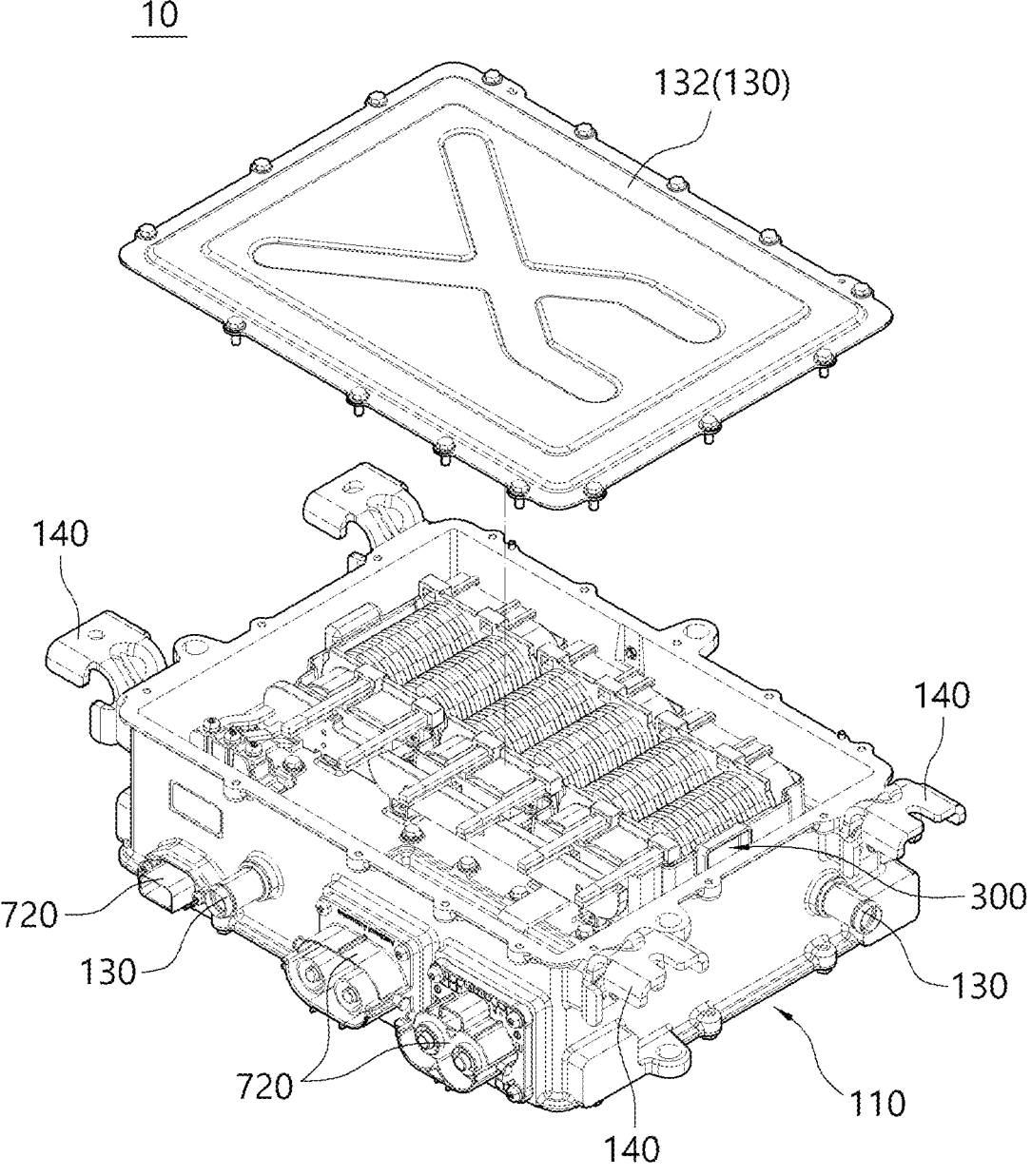

Referring to FIG. 12, the lower cover 122 covers the inductor module 300 and the lower space 132 accommodating the inductor module 300 and is coupled to the housing body 110 (S150).

Accordingly, the lower space 132 is sealed by the lower cover 122, the cooling plate 210 and the housing body 110, and any communication with the outside is blocked.

(2) Description of the Step (S200) of Accommodating a Component in the Other Space Inside the Main Housing 100.

It is a step (S200) in which the remaining component of the DC converter 10 is accommodated in the other one space of the plurality of spaces partitioned inside the main housing 100. Hereinafter, this step (S200) will be described in detail with reference to FIGS. 6 to 11 and 15.

Figure 6:
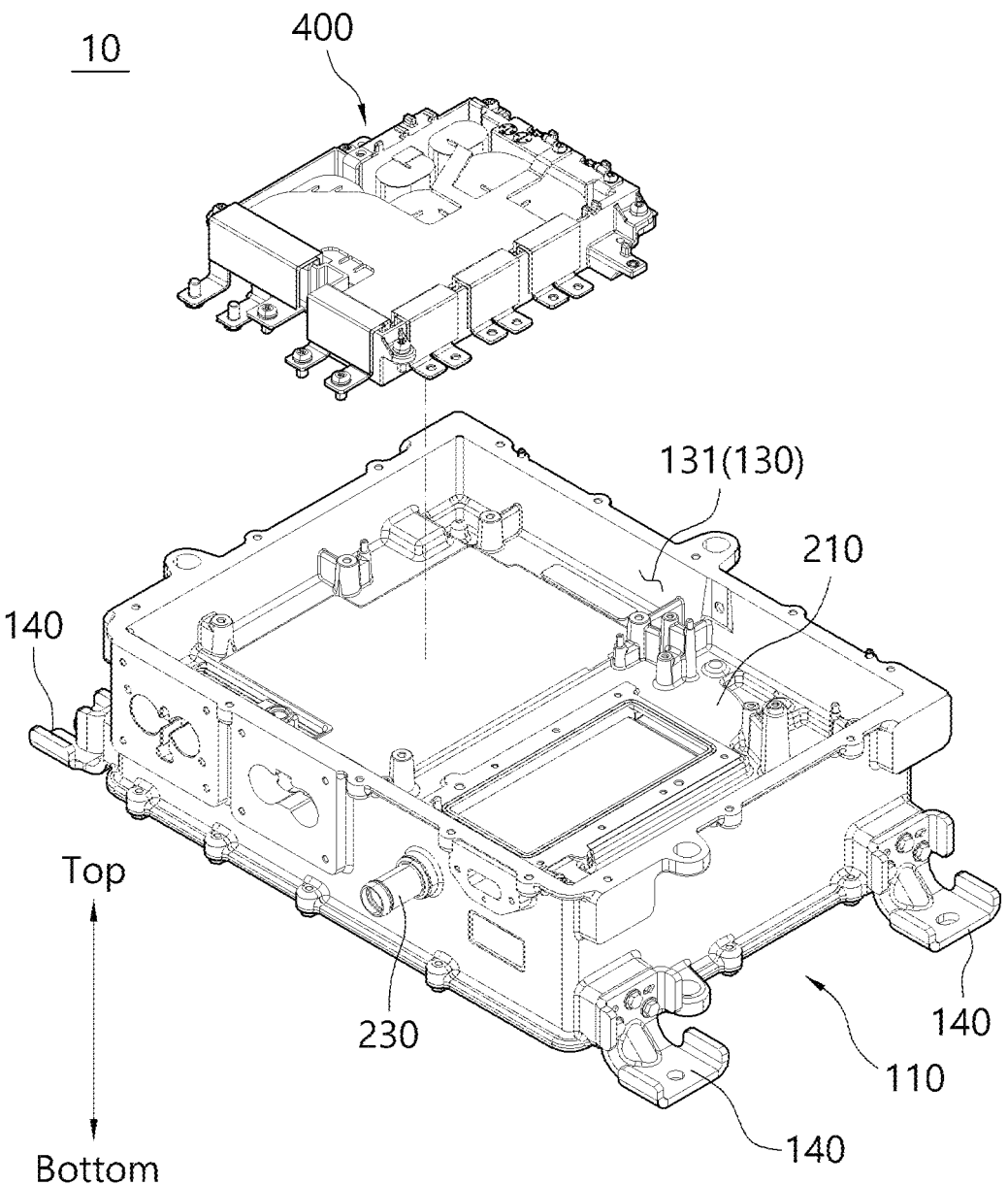
FIG. 6 is an exploded perspective view illustrating the coupling process of a main housing and a capacitor module provided in the DC converter of FIG. 1.

Referring to FIG. 6, the capacitor module 400 is accommodated in the other space in which the inductor module 300 is not disposed among the plurality of spaces partitioned by the cooling plate 210, which is in the upper space 131 in the illustrated exemplary embodiment. (S210). In this case, the capacitor module 400 covers a part of the cooling plate 210 and is accommodated in the upper space 131.

This is because the size (i.e., cross-sectional area) of the capacitor module 400 is formed to be smaller than the size (i.e., cross-sectional area) of the cooling plate 210 such that it is biased toward one side (the left side in the illustrated exemplary embodiment) of the upper space 131.

Figure 7:
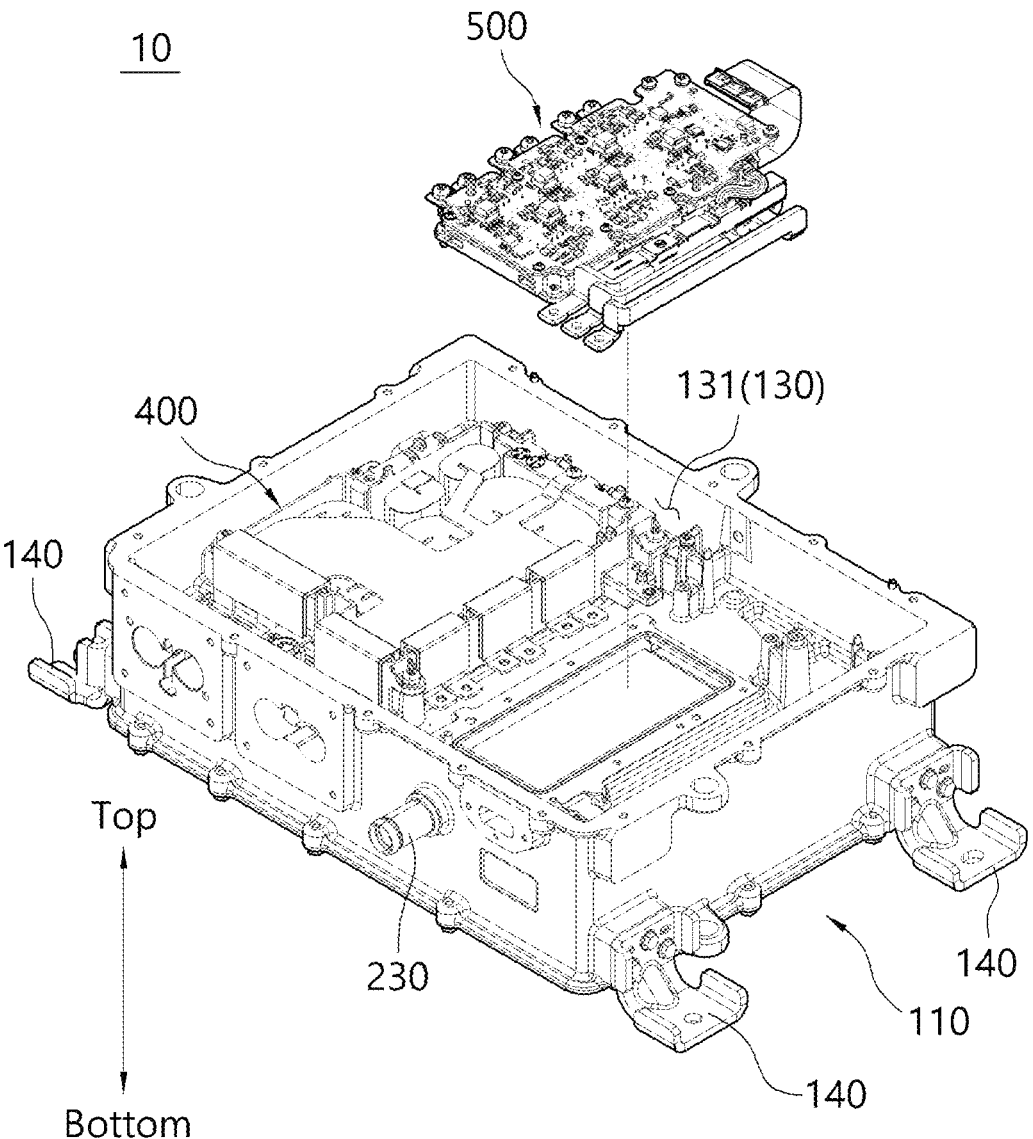
FIG. 7 is an exploded perspective view illustrating the coupling process of a main housing and a semiconductor module provided in the DC converter of FIG. 1.

Referring to FIG. 7, the semiconductor module 500 is accommodated in the upper space 131 to be adjacent to the capacitor module 400 (S220). In this case, the semiconductor module 500 is accommodated in the upper space 131 while covering the remaining part of the cooling plate 210.

This will be understood because the size of the semiconductor module 500 is formed to be smaller than the size of the cooling plate 210, and is biased toward the other side (the right side in the illustrated exemplary embodiment) of the upper space 131.

Figure 8:
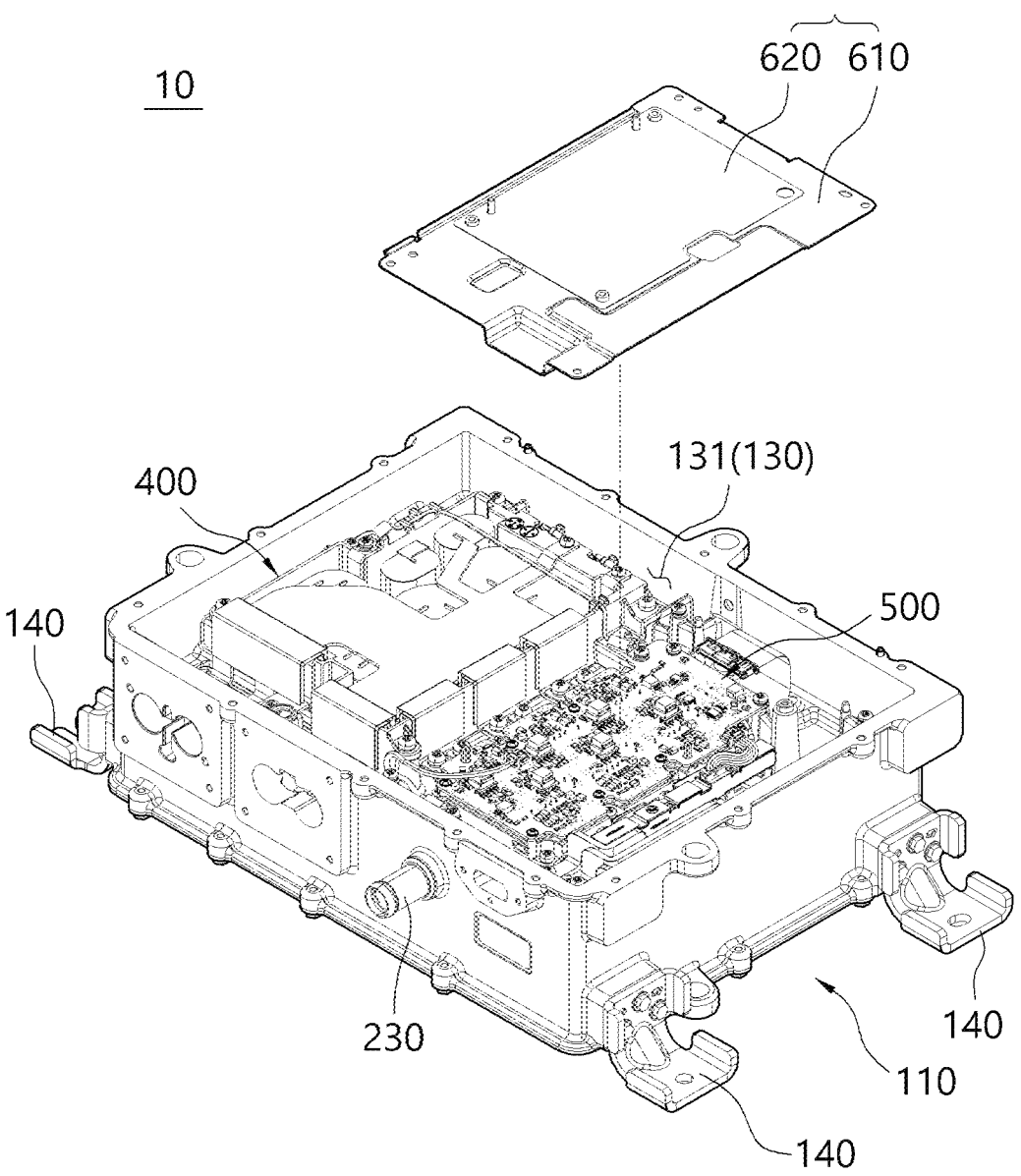
FIG. 8 is an exploded perspective view illustrating the coupling process of a main housing and a shielding module provided in the DC converter of FIG. 1.

Referring to FIG. 8, the shielding module 600 covers the semiconductor module 500 and is accommodated in the upper space 131 (S230). In this case, since the semiconductor module 500 is located to be biased toward the other side of the upper space 131, it will be understood that the shielding module 600 is also located to be biased toward the other side of the upper space 131.

Figure 9:
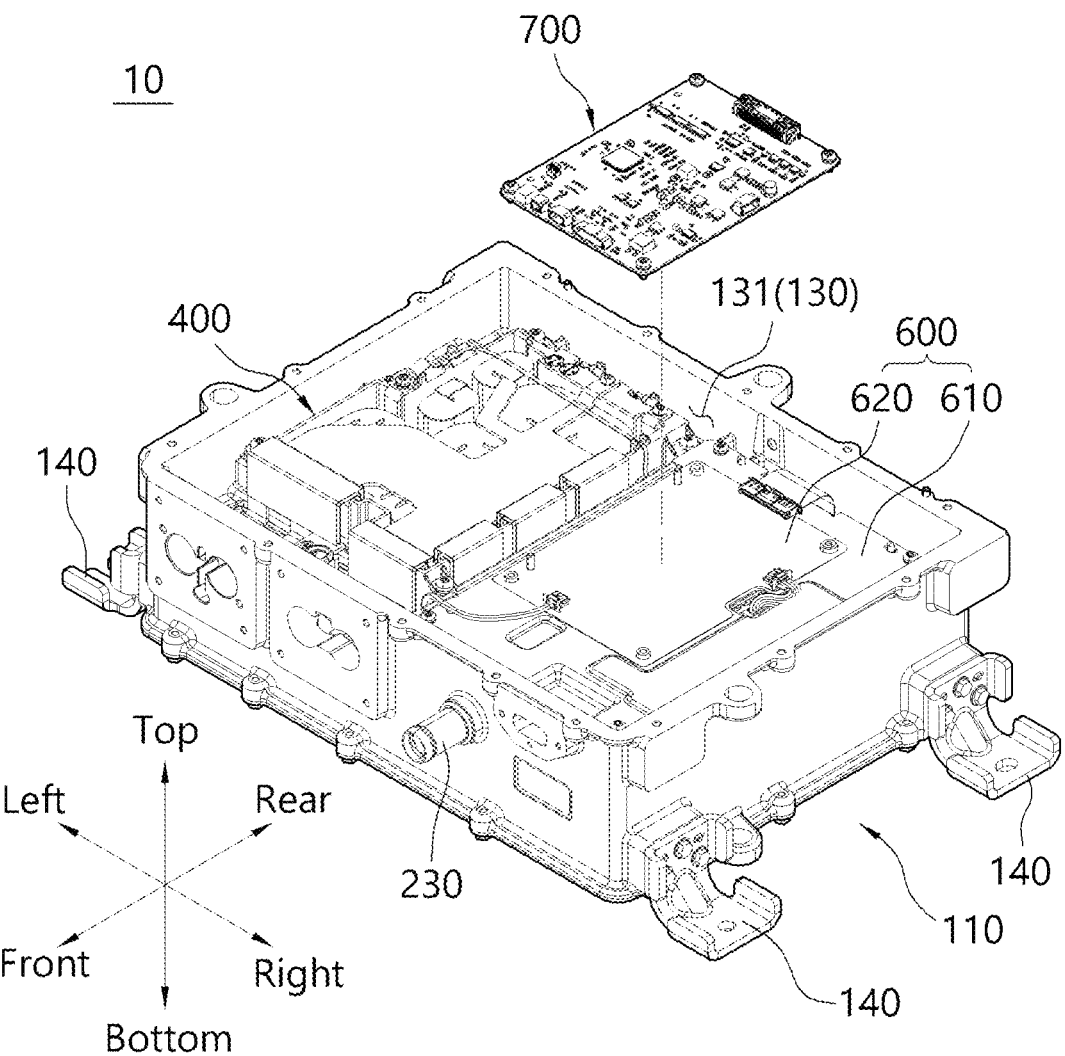
FIGS. 9 and 10 are exploded perspective views illustrating the coupling process of a main housing and an energization module provided in the DC converter of FIG. 1.

Referring to FIG. 9, the PCB unit 710 covers the shielding module 600 and the semiconductor module 500 and is accommodated in the upper space 131 (S240). It will be understood that the PCB unit 710 is also biased toward the other side of the upper space 131 like the semiconductor module 500 and the shielding module 600.

Figure 10:
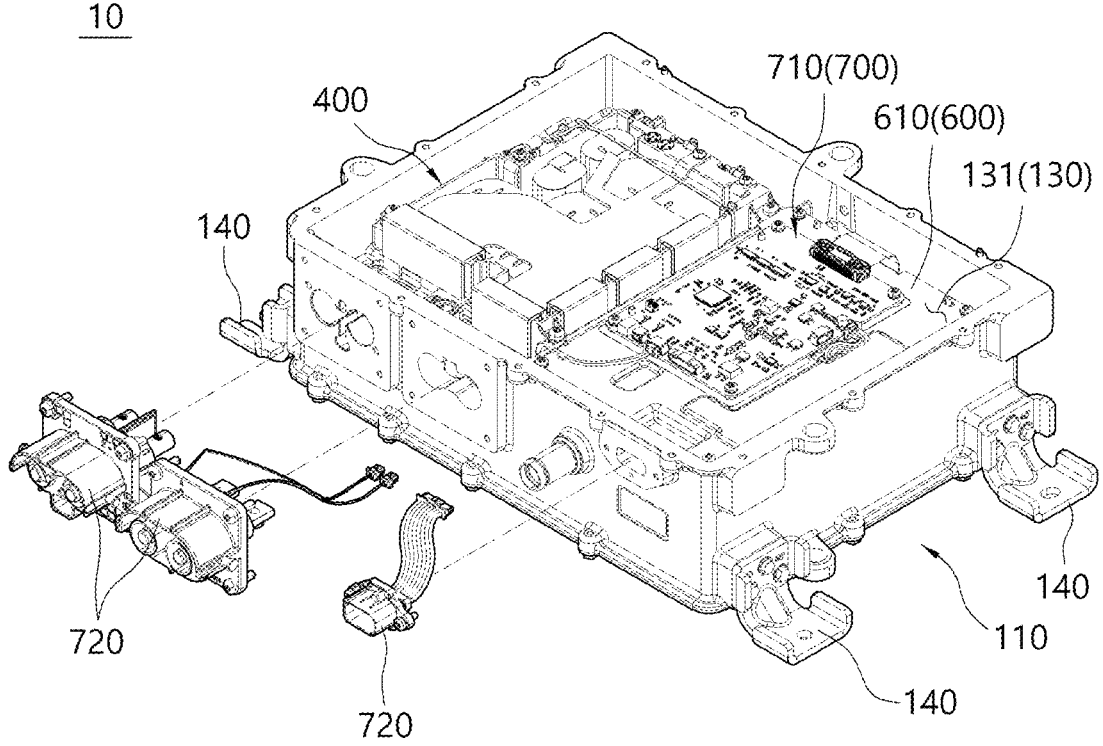
Figure 11:
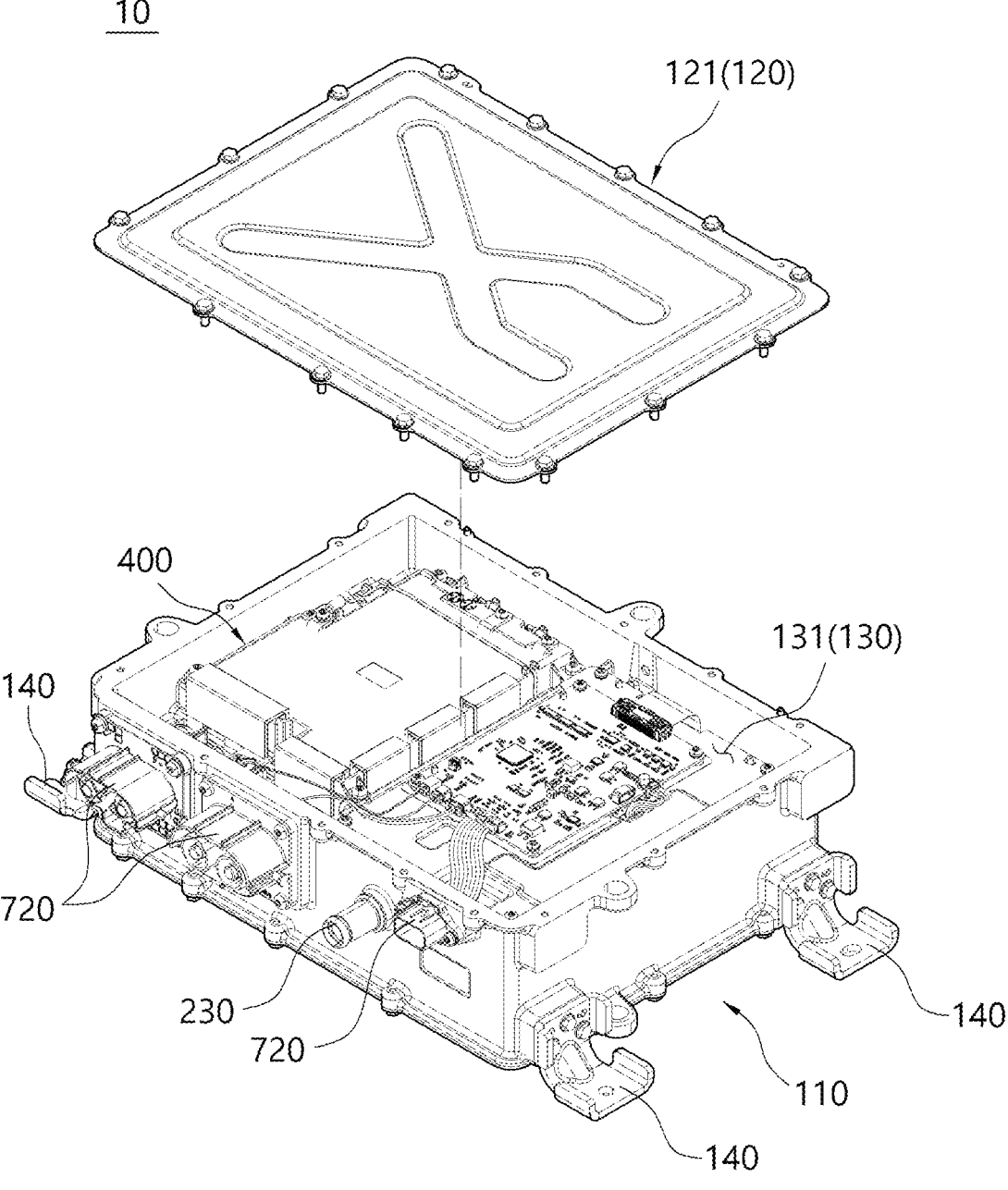
FIGS. 11 and 12 are exploded perspective views illustrating a process in which a housing body and a housing cover of the main housing provided in the DC converter of FIG. 1 are coupled.

Referring to FIG. 10, the connector unit 720 is coupled to the housing body 110 to conduct electricity with the inductor module 300 (S250). A part of the connector unit 720 may be located inside the accommodation space 130, and the other part may be located outside the housing body 110. In an exemplary embodiment, the connector unit 720 may be coupled through the housing body 110.

The connector unit 720 may conduct electricity with the inductor module 300. As described above, the connector unit 720 may conduct electricity with the PCB unit 710, and the PCB unit 710 may conduct electricity with the inductor module 300, the capacitor module 400 and the semiconductor module 500, respectively.

Figure 13:
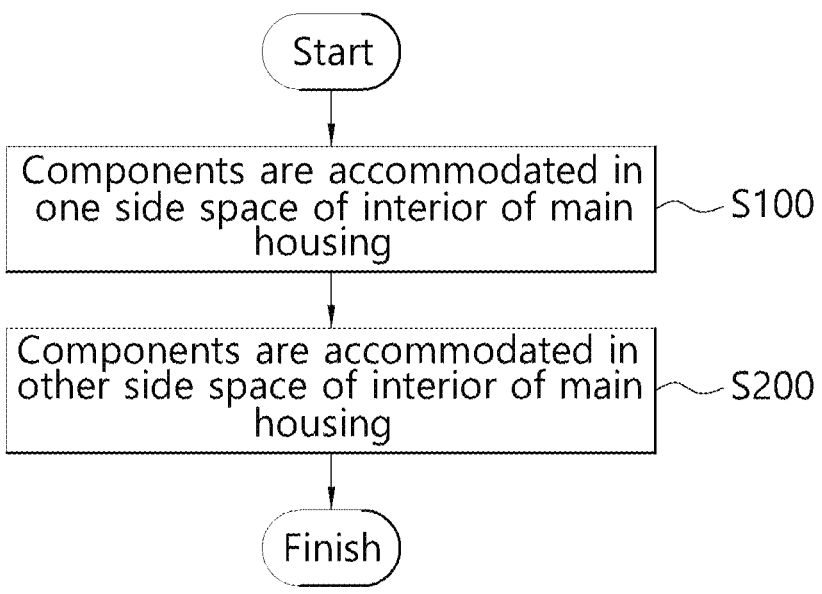
FIG. 13 is a flowchart illustrating the flow of the method for manufacturing a DC converter according to an exemplary embodiment of the present disclosure.
Figure 14:
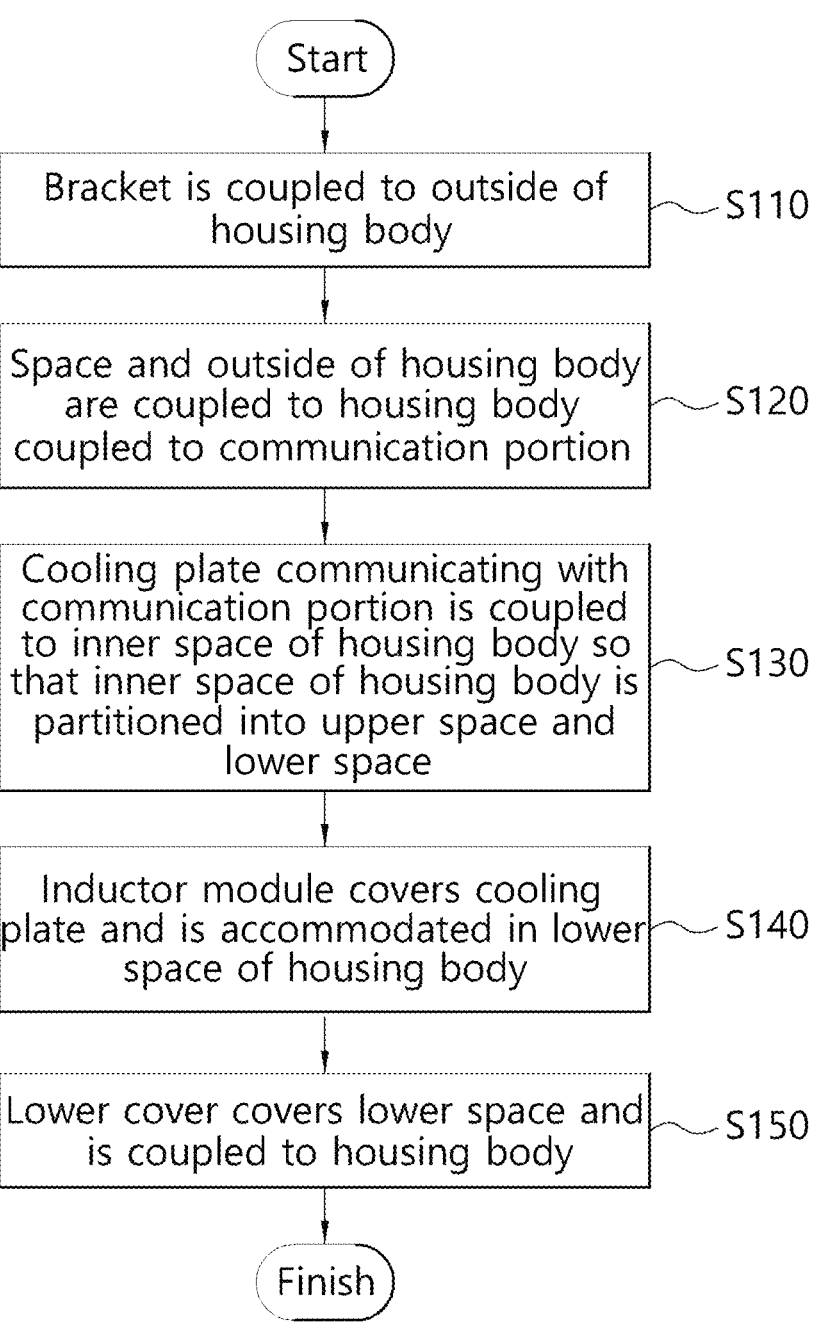
FIG. 14 is a flowchart illustrating the detailed flow of step S100 in the method for manufacturing the DC converter of FIG. 13.
Figure 15:
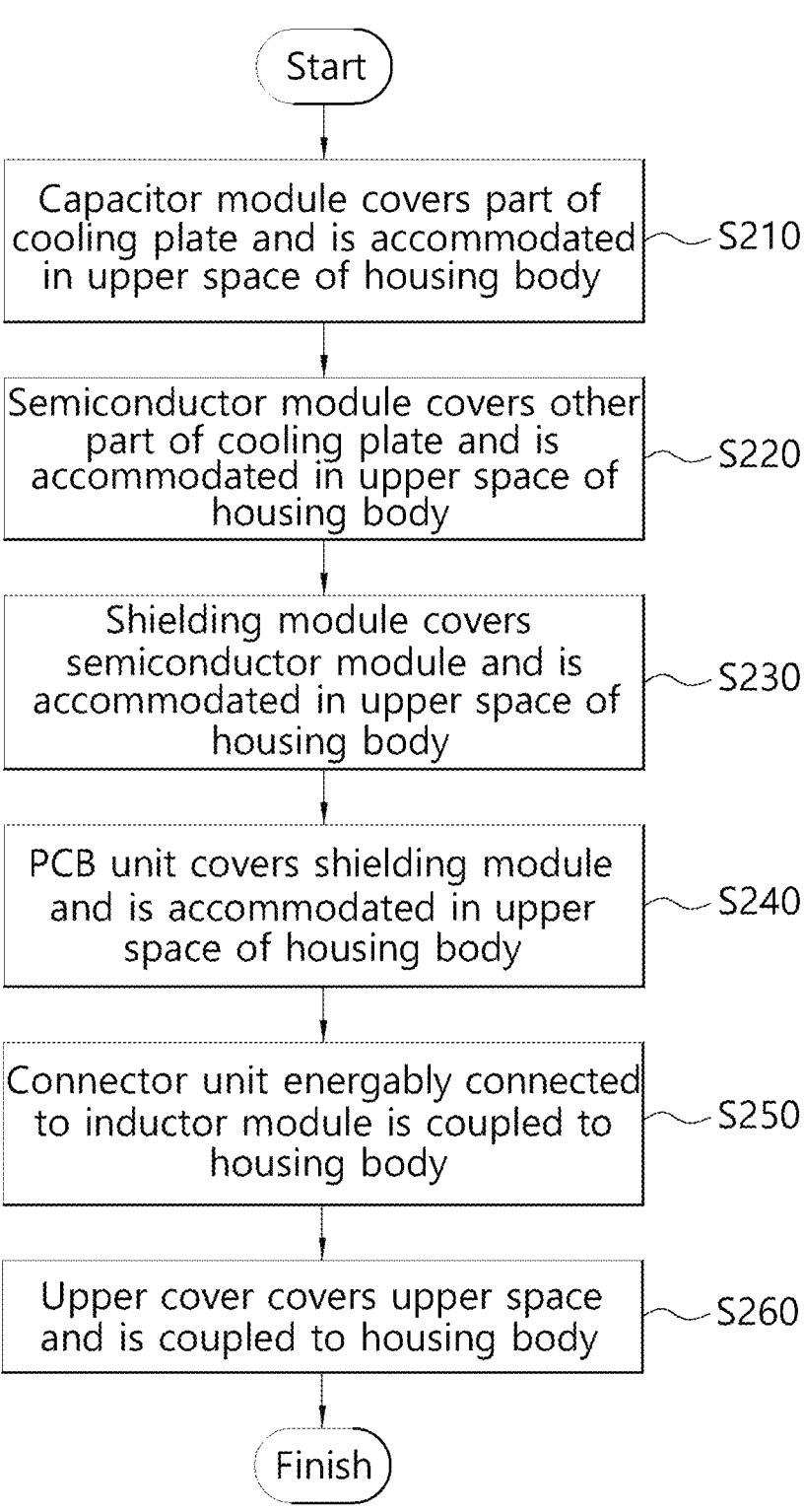
FIG. 15 is a flowchart illustrating the detailed flow of step S200 in the method for manufacturing the DC converter of FIG. 13.

Referring to FIG. 13, the upper cover 121 covers the capacitor module 400, the semiconductor module 500 and the shielding module 600, and the upper space 131 for accommodating the same and is coupled to the housing body 110 (S260).

Accordingly, the upper space 131 is sealed by the upper cover 121, the cooling plate 210 and the housing body 110, and any communication with the outside is blocked.

In the method for manufacturing an DC converter 10 according to an exemplary embodiment of the present disclosure described above, after the inductor module 300 is first accommodated in the lower space 132, the capacitor module 400, the semiconductor module 500 and the shielding module 600 have been described on the assumption that these are accommodated in the upper space 131.

Alternatively, the step (S200) of accommodating the components in the upper space 131 may precede the steps (S140 and S150) of accommodating the component in the lower space 132.

However, even in the alternative exemplary embodiment, it will be understood that the step (S130) of the cooling plate 210 partitioning the accommodation space 130 into the upper space 131 and the lower space 132 must be preceded.

Although the above has been described with reference to the preferred exemplary embodiment of the present disclosure, those of ordinary skill in the art will understand that it is possible to variously modify and change the present disclosure within the scope without departing from the spirit and scope of the present disclosure described in the claims below.

10: DC converter
    100: Main housing
    110: Housing body
    120: Housing cover

121: Upper cover
122: Lower cover
130: Accommodation space
131: Upper space
132: Lower space
140: Bracket
200: Cooling module
210: Cooling plate
220: Flow passage
230: Communication portion
300: Inductor module
400: Capacitor module
500: Semiconductor module
600: Shielding module
610: Shield plate
620: Insulating paper
700: Energization module
710: PCB unit
720: Connector unit

The invention claimed is:

1. A vehicle, comprising:

a main housing having an accommodation space formed therein and includes an upper cover disposed to cover an upper space of the accommodation space and a lower cover disposed to cover a lower space of the accommodation space;

a cooling module which is coupled to the main housing to partition the accommodation space into the upper space and the lower space, and to discharge heat generated in the accommodation space to an outside;

an inductor module which is accommodated in the lower space and located adjacent to the cooling module;

a capacitor module which is disposed on one side of the upper space, located adjacent to the cooling module and disposed to be stacked with the inductor module with the cooling module interposed therebetween;

a semiconductor module which is disposed on the other side of the upper space so as to be adjacent to an upper side of the cooling module and the capacitor module, and is configured to convert DC power applied from the outside into AC power;

a shielding module which covers the semiconductor module and is disposed on the other side of the upper space to electrically separate the semiconductor module from the outside; and an energization module which is disposed on the other side of the upper space, is energizably connected to at least one of the inductor module, the capacitor module and the semiconductor module, and is energizably connected to an external power source and load.

2. The vehicle of claim 1, wherein the main housing comprises:

a housing body which surrounds the accommodation space in an outer peripheral direction; and brackets which are respectively provided on a pair of surfaces of the housing body facing each other with the accommodation space interposed therebetween, and are coupled to the outside.

3. The vehicle of claim 2, wherein the cooling module comprises:

a cooling plate which is formed in a plate shape and is positioned between the capacitor module, the semiconductor module and the inductor module to be configured to receive heat generated from the capacitor module and the semiconductor module or the inductor module;

a flow passage which is formed to be recessed inside the cooling plate, extends between different corners of the cooling plate and has each end open in an extending direction thereof, wherein communication portions are respectively provided on another pair of surfaces facing each other with the accommodation space among the surfaces of the housing body.

4. A DC converter, comprising:

a main housing having an accommodation space formed therein and includes an upper cover disposed to cover an upper space of the accommodation space and a lower cover disposed to cover a lower space of the accommodation space;

a cooling module which is coupled to the main housing to partition the accommodation space into the upper space and the lower space, and to discharge heat generated in the accommodation space to an outside;

an inductor module which is accommodated in the lower space and located adjacent to the cooling module;

a capacitor module which is disposed on one side of the upper space, located adjacent to the cooling module and disposed to be stacked with the inductor module with the cooling module interposed therebetween;

a semiconductor module which is disposed on the other side of the upper space, located adjacent to the capacitor module and the cooling module, respectively, and disposed to be stacked with the inductor module with the cooling module interposed therebetween;

a shielding module which covers the semiconductor module and is disposed on the other side of the upper space to electrically shield the semiconductor module from the outside; and an energization module which covers the shield module, is disposed on the other side of the upper space and is electrically connected to an external power source or load.

5. The DC converter of claim 4, wherein the cooling module comprises:

a cooling plate having a predetermined thickness in a height direction of the main housing and a cross-section corresponding to a cross-section of the accommodation space, and which absorbs heat generated by the inductor module or the capacitor module; and a flow passage which is formed to be recessed inside the cooling plate and extends between at least two different corners among corners of the cooling plate through which a fluid absorbing the heat generated in the accommodation space flows.

6. The DC converter of claim 5, wherein the cooling plate is disposed to be spaced apart from one end and the other end in the height direction of the main housing, wherein any one of the inductor module and the capacitor module is disposed in a space formed between the cooling plate and the one end, and wherein the other one of the inductor module and the capacitor module is disposed in a space formed between the cooling plate and the other end.

7. The DC converter of claim 5, wherein the cooling module comprises a communication portion which is coupled through the main housing and communicates with an end of the flow passage and an external fluid supply source, respectively.

8. The DC converter of claim 7, wherein the main housing partially surrounds the accommodating space and comprises a housing body having a through hole which communicates with the accommodating space and the outside therein, and wherein the communication portion is through-coupled to the through hole formed in the housing body, a part of which is located in the accommodation space, and another part of which is located outside the main housing.

9. The DC converter of claim 8, wherein the housing body comprises a plurality of surfaces surrounding the accommodation space from different sides, wherein the through hole is formed through each of the plurality of surfaces, and wherein a plurality of communication portions are provided, and the plurality of communication portions are through-coupled to a plurality of through holes and communicate with one end and another end of an extension direction of the flow passage, respectively.

10. The DC converter of claim 5, wherein the fluid which is configured to absorb the heat generated by the inductor module or the capacitor module flows in the flow passage.

11. The DC converter of claim 4, wherein the shielding module comprises:

a shield plate which is positioned between the semiconductor module and the energization module to physically separate the semiconductor module and the energization module; and an insulating sheet which covers the shield plate and is positioned between the shield plate and the energization module to electrically block the semiconductor module and the energization module.

12. A method for manufacturing a DC converter, comprising the steps of:

(a) forming an upper space and a lower space inside a main housing by accommodating a cooling plate in an accommodation space of the main housing to partition the accommodation space into the upper space and the lower space;

(b) accommodating a first component in the low space of the interior of the main housing; and (c) accommodating a second component in the upper space of the main housing to be stacked with the first component with the cooling module interposed therebetween, wherein step (b) comprises the steps of:

(b1) covering a cooling plate accommodated inside the main housing by an inductor module to be accommodated in the low space; and (b2) covering the inductor module and the low space by a low cover to be coupled to a housing body, so as to seal the low space, wherein step (c) comprises the step of:

(c1) covering a cooling plate accommodated inside the main housing by a capacitor module to be accommodated in one side of the upper space;

(c2) covering the cooling plate accommodated inside the main housing by a semiconductor module to be accommodated in the other side of the upper space;

(c3) covering the semiconductor module by a shielding module to be accommodated in the other side of the upper space;

(c4) covering the shielding module by a PCB unit to be accommodated in the other side of the upper space; and (c5) covering the capacitor module, the semiconductor module, the shielding module and the PCB unit by a upper cover to be coupled to a housing body, so as to seal the other side of the upper space.

* * * * *